United States Patent
Anderson et al.

(10) Patent No.: US 9,919,929 B2
(45) Date of Patent: Mar. 20, 2018

(54) GRAPHENE ETCHING METHODS, SYSTEMS, AND COMPOSITES

(71) Applicant: EMPIRE TECHNOLOGY DEVELOPMENT LLC, Wilmington, DE (US)

(72) Inventors: Kraig Anderson, Burlingame, CA (US); Angele Sjong, Louisville, CO (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 15/100,616

(22) PCT Filed: Dec. 9, 2013

(86) PCT No.: PCT/US2013/073886
§ 371 (c)(1),
(2) Date: May 31, 2016

(87) PCT Pub. No.: WO2015/088478
PCT Pub. Date: Jun. 18, 2015

(65) Prior Publication Data
US 2016/0297682 A1  Oct. 13, 2016

(51) Int. Cl.
*B32B 3/00* (2006.01)
*C01B 31/04* (2006.01)
(Continued)

(52) U.S. Cl.
CPC .......... *C01B 31/0484* (2013.01); *B05D 1/005* (2013.01); *B05D 1/02* (2013.01);
(Continued)

(58) Field of Classification Search
CPC . C01B 31/0484; C01B 31/0438; B05D 1/005; B05D 1/02; B05D 1/18;
(Continued)

(56) References Cited

U.S. PATENT DOCUMENTS 9,607,725 B2 *  3/2017  Sandhu
2010/0035186 A1  2/2010  Hong et al.
(Continued)

OTHER PUBLICATIONS

Caldwell, J.D., et al., "Epitaxial graphene: dry transfer and materials characterization," Proceedings of the SPIE, vol. 7761, pp. 7 (Aug. 25, 2010).
(Continued)

*Primary Examiner* — Elizabeth E Mulvaney
(74) *Attorney, Agent, or Firm* — Dorsey & Whitney LLP

(57) ABSTRACT

Techniques described herein generally relate to etching graphene. The techniques can include disposing graphene on a patterned substrate, applying a resist to the graphene on the patterned substrate, curing the resist, and etching exposed portions of the graphene. Graphene composites including patterned substrates, graphene disposed on the patterned substrate, and a resist disposed on the graphene, are disclosed. Systems configured to perform the methods and/or make the graphene composites are also disclosed.

21 Claims, 5 Drawing Sheets

(51) Int. Cl.
| | |
|---|---|
| B05D 1/00 | (2006.01) |
| B05D 1/02 | (2006.01) |
| B05D 1/18 | (2006.01) |
| B05D 1/28 | (2006.01) |
| H01J 37/32 | (2006.01) |
| H01L 21/04 | (2006.01) |
| H01L 29/16 | (2006.01) |
| C01B 32/194 | (2017.01) |
| H01L 21/3065 | (2006.01) |
| H01L 21/308 | (2006.01) |

(52) U.S. Cl.
CPC ............... *B05D 1/18* (2013.01); *B05D 1/28* (2013.01); *C01B 32/194* (2017.08); *H01J 37/32009* (2013.01); *H01L 21/042* (2013.01); *H01L 29/1606* (2013.01); *H01J 2237/334* (2013.01); *H01L 21/3065* (2013.01); *H01L 21/3081* (2013.01)

(58) Field of Classification Search
CPC ..... B05D 1/28; H01L 29/1606; H01L 21/042; H01L 21/3065; H01L 21/3081
See application file for complete search history.

(56) References Cited

U.S. PATENT DOCUMENTS

| | | |
|---|---|---|
| 2012/0049200 A1 | 3/2012 | Abraham et al. |
| 2012/0199957 A1 | 8/2012 | Pohlers et al. |
| 2013/0210218 A1 | 8/2013 | Accardi et al. |

OTHER PUBLICATIONS

Caldwell, J.D., et al., "Technique for the dry transfer of epitaxial graphene onto arbitrary substrates," ACS Nano, vol. 4, No. 2, pp. 1108-1114 (Jan. 25, 2010).

Chen, Y., et al., "Enhanced Stability and Bioconjugation of Photo-cross-linked Polystrene-Shell, Au-Core Nanoparticles," Langmuir, vol. 23, No. 14, pp. 7491-7497 (May 27, 2007).

Childres, I., et al., "Effect of oxygen plasma etching on graphene studied using Raman spectroscopy and electronic transport measurements," New Journal of Physics, vol. 13, pp. 025008-1-025008-12 (2011).

Crespy, D., and Landfester, K., "Miniemulsion polymerization as a versatile tool for the synthesis of functionalized polymers," Beilstein Journal of Organic Chemistry, vol. 6, pp. 1132-1148 (Dec. 1, 2010).

International Search Report and Written Opinion for International Application No. PCT/US13/73886, dated Apr. 16, 2014.

Lee, Y., et al., "Wafer-Scale Synthesis and Transfer of Graphene Films," ACS Nano Letters, vol. 10, No. 2, pp. 490-493 (Jan. 4, 2010).

Li, X., and Zhao, Y., et al., "Protection/Deprotection of Surface Activity and Its Applications in the Controlled Release of Liposomal Contents," Langmuir, vol. 28, Issue 9, pp. 4251-4259 (Mar. 6, 2012).

Li X., et al., "Transfer of Large-Area Graphene Films for High-Performance Transparent Conductive Electrodes," Nano Letters, vol. 9, No. 12, pp. 4359-4363 (Oct. 21, 2009).

Paul, G.K., et al., "Synthesis and Vesicular Polymerization of Novel Counter-Ion Polymerizable/Crosslinkable Sufractants," Journal of Polymer Part A: Polymer Chemistry, vol. 42, Issue 20, pp. 5271-5283 (Oct. 2004).

Pham, P., "Transferring CVD Grown Graphene," NNIN REU Research Accomplishments, pp. 192-193 (2010).

Pusztay, S.V., et al., "Encagement of Gold Nanoclusters in Cross-linked Resorcinarene Shells," Supramolecular Chemistry, vol. 14, Issues 2-3, pp. 291-294 (Mar. 2002).

Rafiee, J., et al., "Wetting transparency of grapheme," Nature Materials, vol. 11, pp. 217-222 (Jan. 22, 2012).

Rao, F., et al., "Layer engineering of graphene with oxygen plasma etching," 11th IEEE Conference on Nanotechnology (IEEE-NANO), pp. 1201-1204 (Aug. 15-18, 2011).

Regan, W., et al., "A direct transfer of layer-area grapheme," Applied Physics Letters, vol. 96, Issue 11, pp. 113102-1-113102-3 (Apr. 2010).

Rosenbauer, E.-M., et al., "Surface-active monomer as a stabilizer for polyurea nanocapsules synthesized via interfacial polyaddition in inverse miniemulsion," Langmuir, vol. 25, Issue 20, pp. 12084-12091 (Jul. 20, 2009).

Shibasaki, Y., et al., "Crosslinked, glassy styrenic surfactants stabilize quantum dots against environmental extremes," Journal of Material Chemistry, vol. 19, Issue 35, pp. 6324-6327 (Jun. 19, 2009).

\* cited by examiner

US 9,919,929 B2

GRAPHENE ETCHING METHODS, SYSTEMS, AND COMPOSITES

CROSS-REFERENCE TO RELATED APPLICATION

This application is a U.S. national stage filing under 35 U.S.C. § 371 of International Application No. PCT/US2013/073886, filed on Dec. 9, 2013.

BACKGROUND

Unless otherwise indicated herein, the materials described in this section are not prior art to the claims in this application and are not admitted to be prior art by inclusion in this section.

Graphene and graphene derivatives have potential applications in a variety of areas, such as electronic components. However, known methods of nanoscale fabrication of graphene for use in electronics can be slow and cannot be scaled to a requisite production level for manufacturing. Moreover, the methods may require heating to high temperatures such as between 500° C. to 1000° C., which can be inconvenient, energy intensive, and potentially incompatible with other materials that may accompany the graphene fabrication.

SUMMARY

Some embodiments relate to a method for etching graphene, the method comprising, for example: providing a patterned substrate comprising one or more hydrophobic regions and one or more hydrophilic regions patterned on a surface of the patterned substrate; disposing graphene on the surface of the patterned substrate; applying a resist to a surface of the graphene opposite to the patterned substrate, wherein the resist selectively adheres to portions of the surface of the graphene overlying either the hydrophobic regions or the hydrophilic regions of the patterned substrate, and wherein portions of the surface of the graphene not covered by the resist form exposed portions of the graphene; and etching the exposed portions of the graphene to form one or more etched graphene structures.

Some embodiments relate to a graphene composite comprising, for example: a patterned substrate comprising one or more hydrophobic regions and one or more hydrophilic regions patterned on a surface of the patterned substrate; graphene disposed on the surface of the patterned substrate; and a resist disposed on portions of a surface of the graphene opposite to the patterned substrate on either the hydrophobic regions or the hydrophilic regions of the patterned substrate.

Some embodiments relate to a graphene composite comprising, for example: a patterned substrate comprising one or more hydrophobic regions and one or more hydrophilic regions patterned on a surface of the patterned substrate; and one or more graphene structures overlying either the one or more hydrophobic regions or the one or more hydrophilic regions of the patterned substrate, wherein a shape of the one or more graphene structures corresponds to a shape of the hydrophobic regions or the hydrophilic regions of the patterned substrate.

Some embodiments relate to a system for making etched graphene structures, the system comprising, for example: a controller; a graphene applicator configured via the controller to apply graphene to a patterned substrate comprising one or more hydrophilic regions and one or more hydrophobic regions; a resist applicator configured via the controller to apply a resist to a surface of the graphene layer opposite to the patterned substrate, the resist selectively adheres to portions of surface of the graphene overlying either the hydrophobic regions or the hydrophilic regions of the patterned substrate, and portions of the surface of the graphene not covered by the resist form exposed portions of the substrate; and an etching device configured via the controller to etch the exposed portions of the graphene to form one or more etched graphene structures.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings.

DETAILED DESCRIPTION

Figure 1:
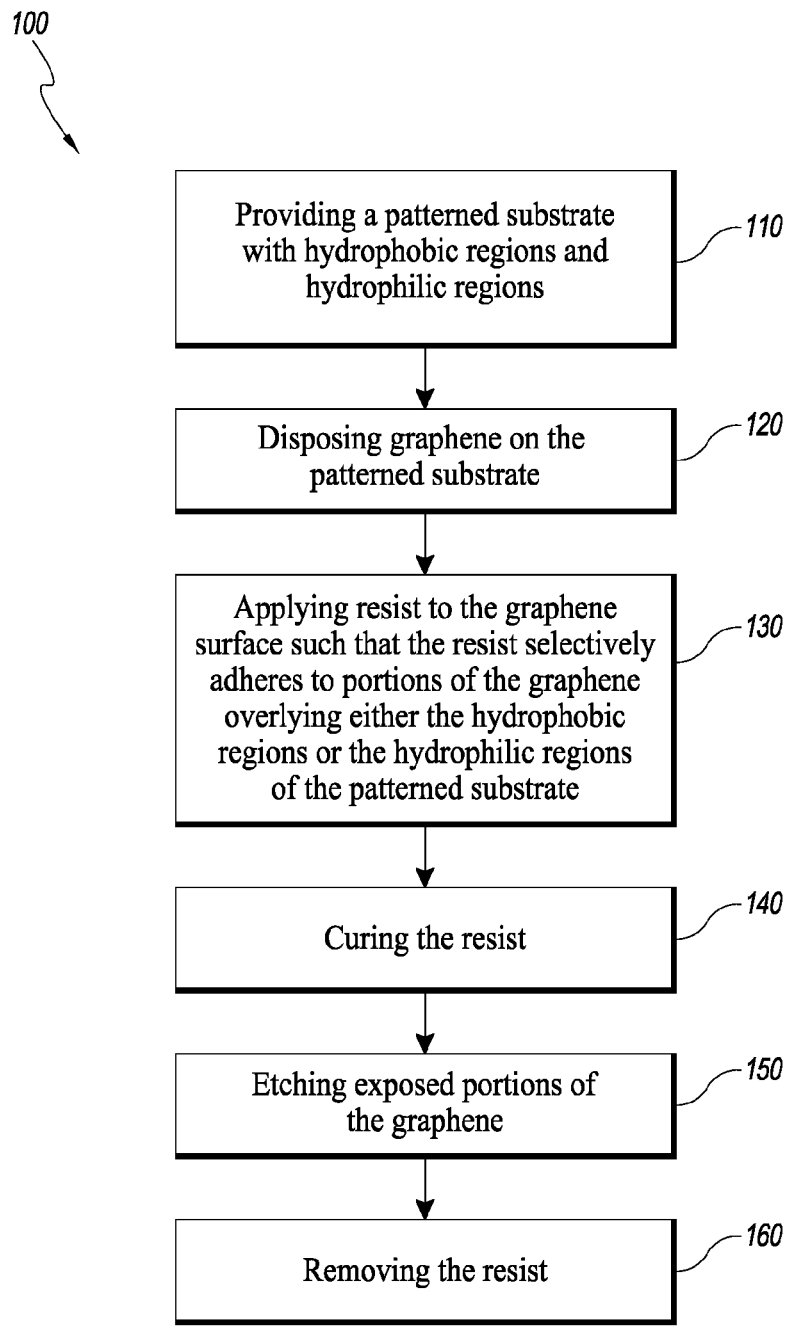
FIG. 1 is a flow diagram illustrating one example of a method of etching graphene in accordance with at least some embodiments.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

As used herein, "haloalkyl" refers to an alkyl group in which one or more of the hydrogen atoms are replaced by a halogen (for example, mono-haloalkyl, di-haloalkyl and tri-haloalkyl). Such groups include but are not limited to, chloromethyl, fluoromethyl, difluoromethyl, trifluoromethyl, 1-chloro-2-fluoromethyl and 2-fluoroisobutyl.

The present disclosure generally describes methods for etching graphene. In some embodiments, the method can include providing a patterned substrate, disposing graphene on the patterned substrate, and applying a resist to a surface of the graphene opposite to the patterned substrate. The patterned substrate may include one or more hydrophobic regions and one or more hydrophilic regions patterned on a surface of the substrate. When the resist is applied to the surface of the graphene, the resist may selectively adhere to portions of the surface of the graphene overlying either the hydrophobic regions or the hydrophilic regions of the patterned substrate. Portions of the surface of the graphene not covered by the resist would form exposed portions of the graphene. The method may further include etching the exposed portions of the graphene. The method may also further include curing the resist, for example, before the etching step.

The present disclosure also relates to graphene composites including, for example, a patterned substrate having one or more hydrophobic regions and one or more hydrophilic regions patterned on a surface of the patterned substrate, graphene disposed on the surface of the patterned substrate, and a resist disposed on portions of a surface of the graphene opposite to the patterned substrate on either the hydrophobic regions or the hydrophilic regions of the patterned substrate.

Systems configured to perform the methods and/or to make the graphene composites are also disclosed.

Some embodiments disclosed herein include a method of etching graphene. FIG. 1 is a flow diagram illustrating one example of method 100 of etching graphene in accordance with at least some embodiments. As illustrated in FIG. 1, method 100 may include one or more functions, operations, or actions as shown by one or more of operations 110-160. FIGS. 2A-E show cross-sectional views of the graphene structures at various stages of the method 100 as depicted in FIG. 1.

Processing for method 100 may begin at operation 110, "Providing a patterned substrate with hydrophobic regions and hydrophilic regions." Operation 110 may be followed by operation 120, "Disposing graphene on the patterned substrate." Operation 120 may be followed by operation 130, "Applying resist to the graphene surface such that the resist selectively adheres to portions of the graphene overlying either the hydrophobic regions or the hydrophilic regions on the patterned substrate." Operation 130 may be followed by operation 140, "Curing the resist." Operation 140 may be followed by operation 150, "Etching exposed portions of the graphene." Operation 150 may be followed by operation 160, "Removing the resist."

In FIG. 1, operations 110-160 are illustrated as being performed sequentially with operation 110 first and operation 160 last. It will be appreciated however that these operations may be reordered, combined, and/or divided into additional or different operations as appropriate to suit particular embodiments. In some embodiments, additional operations may be added. In some embodiments, one or more of the operations can be performed at about the same time. In some embodiments, one or more of the operations is optional; for example, in some embodiments, curing the resist may be optional.

At operation 110, "Providing a patterned substrate with hydrophobic regions and hydrophilic regions," the patterned substrate may be obtained by a variety of methods, for example by methods used in conventional semiconductor fabrication processes. In some embodiments, operation 110 may include forming the patterned substrate using one or more of photolithography, ink jet printing, roll-to-roll processing, and gravure printing.

The patterned substrate is also not particularly limited and may be any arrangement. As will be discussed below, the structure of the patterned substrate may be selected depending on the desired structure for the graphene after etching. For example, a circular graphene may be etched using a patterned substrate having circular hydrophobic regions or circular hydrophilic regions. In some embodiments, the patterned substrate may have one or more hydrophilic regions. The hydrophilic regions may include a metal, a polar polymer, or other wettable compositions. Non-limiting examples of suitable metals include copper, aluminum, gold, silver, nickel, iron, cobalt, and alloys thereof. In some embodiments, the patterned substrate may have one or more hydrophobic regions. The hydrophobic regions may include, for example, one or more of a void, a non-polar polymer, or a fluoropolymer. The fluoropolymer may, for example, be polytetrafluoroethylene (for example, TEFLON). The non-polar polymer may, for example, be a polyolefin.

In some embodiments, the hydrophobic regions may also include hydrophilic substrates, such as $SiO_2$ or hydrophilic polymers. For example, the patterned substrate can be a patterned gold substrate. Trenches (or voids) can be etched into the gold substrate to form hydrophobic regions. The elevated or unetched gold regions may form the hydrophilic region.

The hydrophobic and hydrophilic regions may, in some embodiments, be patterned in a two-dimensional lattice. Non-limiting examples of two dimensional lattices include a rhombic lattice, a hexagonal lattice, a square lattice, a rectangular lattice, or a parrallelogrammic lattice.

The dimensions for the hydrophobic regions are not particularly limited and can vary depending on the desired dimensions of the etched graphene. The hydrophobic regions may have a largest dimension of, for example, about 20 mm or less, about 15 mm or less, about 10 mm or less, or about 8 mm or less. In some embodiments, the hydrophobic regions may have a largest dimension equal to or less than about 10 mm. The hydrophobic regions may have a largest dimension of, for example, about 5 nm, about 10 nm, about 15 nm, about 20 nm, about 25 nm, about 30 nm, about 50 nm, about 75 nm, about 100 nm, about 1 μm, about 100 μm, about 500 μm, about 1 mm, about 5 mm, about 10 mm, or a value between any of these values. In some embodiments, the hydrophobic regions may have a largest dimension of about 10 nm to about 20 mm. In some embodiments, the hydrophobic regions may have a largest dimension of about 100 nm to about 1 mm.

The dimensions for the hydrophilic regions are also not particularly limited and can vary depending on the desired dimensions of the etched graphene. The hydrophilic regions may have a largest dimension of, for example, about 20 mm or less, about 15 mm or less, about 10 mm or less, or about 8 mm or less. In some embodiments, the hydrophobic regions may have a largest dimension of about 10 mm or less. The hydrophilic regions may have a largest dimension of, for example, about 10 nm, about 15 nm, about 20 nm, about 25 nm, about 30 nm, about 50 nm, about 75 nm, about 100 nm, about 1 μm, about 100 μm, about 500 μm, about 1 mm, about 5 mm, about 10 mm, or a value between any of these values. In some embodiments, the hydrophilic regions may have a largest dimension of about 10 nm to about 20 mm. In some embodiments, the hydrophilic regions may have a largest dimension of about 100 nm to about 1 mm. The dimensions for the hydrophilic regions can be about the same or different than the dimensions of the hydrophobic regions.

At operation 120, "Disposing graphene on the patterned substrate," the graphene may be disposed on a first surface of the patterned substrate using various techniques. For example, various stamping or roll-to-roll techniques can be used; transfer methods including polymer film adhesion, transfer, and release; growing graphene on a copper substrate and releasing or dissolving the copper substrate to transfer the graphene; or dry transfer of Cu-grown graphene to a metal grid.

Figure 2A:
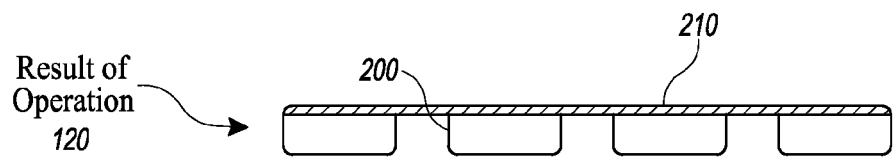
FIGS. 2A-E show cross-sectional views of graphene at various stages of the method in accordance with the flow diagram of FIG. 1.

The thickness of the graphene on the patterned substrate may vary. In some embodiments, the thickness of the graphene may be about 10 nm or less, about 5 nm or less, about 2 nm or less, or about 1 nm or less. In some embodiments, the thickness of the graphene may be equal to or less than about 2 nm. The graphene may include a plurality of vertically stacked graphene sheets, for example, up to six graphene sheets (for example, one, two, three, four, five, or six stacked graphene sheets). In some embodiments, the graphene forms a monolayer, such that the thickness is about one-atom thick (for example, about 0.3 nm thick). In some embodiments, the thickness of the graphene may be about 0.3 nm, about 0.5 nm, about 0.8 nm, about 1 nm, about 1.5 nm, about 2 nm, about 3 nm, about 4 nm, about 5 nm, about 6 nm, about 7 nm, about 8 nm, about 9 nm, about 10 nm, or a thickness between any of these values. FIG. 2A shows an example of graphene 210 on the first surface of the patterned substrate 200 that may, in some embodiments, be obtained by performing operation 120.

At operation 130, "Applying the resist to the graphene surface such that the resist selectively adheres to portions of the graphene overlying either the hydrophobic regions or the hydrophilic regions of the patterned substrate", a resist can be applied that selectively adheres to one or more portions of the graphene. In some embodiments, a hydrophobic resist can be applied such that it selectively adheres to portions of the graphene layer disposed on the hydrophobic regions of the patterned substrate. Without being bound to any particular theory, it is believed that the thin layer of graphene (for example, about one-atom thick) can exhibit the surface properties of a layer immediately below the graphene. In other words, the graphene can be "transparent" to van der Waals interactions that affect surface properties. Thus, a hydrophobic resist can selectively adhere to portions of the graphene overlying the hydrophobic regions of the patterned substrate. The hydrophobic resist may include, for example, one or more of an aryl-epoxy resin (for example, SU-8), poly(methyl methacrylate), a phenol formaldehyde resin (for example, DNQ/novolac resin), or a fluorinated block copolymer containing 2-methyl-2-adamantyl methacrylate (from Idemitsu Kosan Co., Ltd, Japan) and perfluoroalkyl methacrylate (marketed by E. I. DuPont De Nemours and Company, Delaware, USA under the trademark Zonyl®, for example Zonyl® ™ Fluoromonomer, and obtainable from Sigma-Adrich Company, Japan).

In some embodiments, operation 130 may include applying a hydrophilic resist such that it selectively adheres to portions of the graphene layer disposed on the hydrophilic regions of the patterned substrate. As discussed above, the graphene can be "transparent" to van der Waals interactions that affect surface properties such that the hydrophilic resist can selectively adhere to portions of the graphene overlying the hydrophilic regions of the patterned substrate. The hydrophilic resist may include, for example, one or more of poly(methyl glutarimide), poly(methyl methacrylate), or a phenol formaldehyde resin.

In some embodiments, operation 130 may include applying a surfactant resist such that it selectively adheres to portions of the graphene layer disposed on either the hydrophilic regions or hydrophobic regions of the patterned substrate. The surfactant resist may, in some embodiments, include a polar head and a hydrophobic or fluorous tail. The surfactant resist may, in some embodiments, include a hydrophobic head and a hydrophilic tail. In some embodiments, the surfactant resist may include one or more of a block copolymer, a vinyl-containing surfactant, or a thiol-containing surfactant. In some embodiments, the surfactant resist may include a haloalkyl group. In some embodiments, the surfactant resist may include phospholipids (anionic surfactants) such as phosphatidylcholines (PC), phosphatidylserines (PS), phosphatidylethanolamines, phosphatidylinositols, phosphatidylglycerols, phosphatidic acids, lysophospholipids, among others. Examples of suitable phosphatidylcholines (PC) include dipalmitoyl-PC (DPPC), 1-palmitoyl-2-oleoyl-PC (POPC), dioleoyl-PC (DOPC), and dilinoleoyl-PC (DLiPC), among others. Other suitable surfactants include nonionic surfactants such as octylphenol ethoxylates, for example, TRITON™-X series surfactants such as Triton™-X 100 ($C_{14}H_{22}O(C_2H_4O)_n$ where n=9-10)) (Dow Chemical Company, Midland, Mich., United States). As an example, crosslinkable block copolymers that can be applied as a surfactant resists are block-copolymer surfactants such as poly(styrene-block-acrylic acid) (PS-b-$PAA_{XZ}$), [polystyreneco-poly(4-vinyl benzophenone)]-block-poly(acrylic acid) [(PS-co-PVBP)-b-PAA], or [poly(styrene)-co-poly(4-vinyl benzophenone)]-block-poly(ethylene oxide) [(PS-co-PVBP)-b-PEO]. As another example, crosslinkable surfactants such as polystyrene, polyvinyl chloride, silicone, polyethylene, epoxy, polyurethane, saturated polyester, polyamide, or polyimide crosslinkable surfactants may be used as the surfactant resist. As another example, various crosslinkable surfactants that can be used as the surfactant resist include polyisobutylene-succinimide pentamine, dicetyldimethylammonium 4-vinyl benzoate (DDVB), dicetyldimethylammonium 3,5-divinyl benzoate (DDDB), and tripropargylammonium functionalized cationic surfactants. As another example of a surfactant resist is resorcinarene tetraene alkene tetrathiol, which can be modified with a polar moiety by forming a disulfide bond at the tetrathiol moiety to obtain the surfactant.

The surfactant resist may selectively adhere to portions of the graphene on the hydrophobic regions or hydrophilic regions depending on the properties of the surfactant and solvent used to apply the surfactant. For example, a surfactant applied that is mixed with a non-polar solvent (for example, toluene) may typically adhere to the portions of the graphene on the hydrophilic regions of the patterned substrate. The same surfactant applied when mixed with a polar solvent (for example, water) may typically adhere to the portions of the graphene on the hydrophobic regions of the patterned substrate. It will be appreciated that the selectivity of any given surfactant resist can be readily determined by routine testing. For example, a surfactant mixture can be applied to graphene on a patterned substrate and the selectivity can be observed. The pattern for the substrate can then be readily configured to obtain the desired adhesion pattern for the surfactant based on the observed selectivity.

Figure 2B:
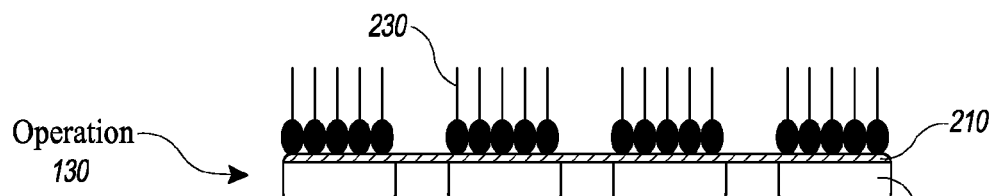

FIG. 2B shows an example of resist 230 applied to graphene layer 210 on patterned substrate 200 which may be obtained, in some embodiments, after performing operation 130.

Figure 2C:
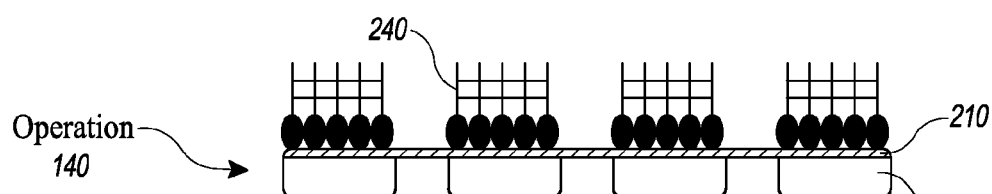

Operation 140, "Curing the resist," may include any standard techniques to harden the resist before etching. In some embodiments, operation 140 may include applying heat, radiation, a cross-linking agent, or a polymerization initiator to the resist. The curing technique will vary depending on the particular resist used. As an example, the block copolymer such as poly(styrene-block-acrylic acid) (PS-b-$PAA_{XZ}$), [polystyreneco-poly(4-vinyl benzophenone)]-block-poly(acrylic acid) [(PS-co-PVBP)-b-PAA], and [poly(styrene)-co-poly(4-vinyl benzophenone)]-block-poly (ethylene oxide) [(PS-co-PVBP)-b-PEO] can be cured by apply a diamine crosslinking agent with a suitable coupling agent. As another example, SU-8 resist can be exposed to ultraviolet light to cure the resist. FIG. 2C shows an example of cured resist 240 applied to graphene layer 210 on patterned substrate 200 which may be obtained, in some embodiments, after performing operation 140.

Figure 2D:
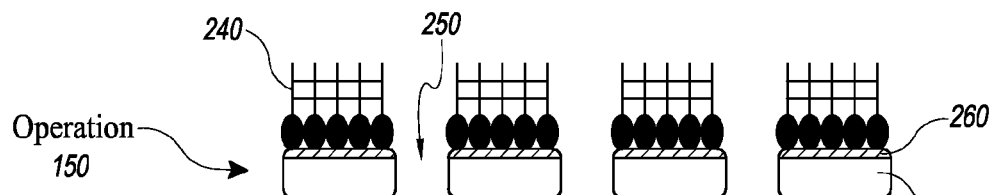

At operation 150, "Etching exposed portions of the graphene" may be carried out by standard techniques known to those skilled in the art. Such techniques may be, for example, dry etching techniques, such as oxygen plasma etching. In some embodiments, operation 150 may include plasma etching. Examples of plasma etching methods include short pulse oxygen plasma etching and one-layer oxygen plasma etching. The cured resist layer may prevent or reduce etching of portions of the graphene below the resist, while exposed portion can be readily etched. Because the position of the resist can be readily controlled by the pattern on the substrate, the etching may also be precisely controlled. FIG. 2D shows an example of etched graphene 260 having etched portions 250 at exposed portions of graphene 210 which may be obtained, in some embodiments, after performing operation 150.

In some embodiments, a hydrophilic resist is applied to the graphene and selectively adheres to portions of the graphene on the hydrophilic regions of the patterned substrate. The portions of the graphene on the hydrophobic region are therefore exposed and etched during operation 150. In some embodiments, a hydrophobic resist is applied to the graphene and selectively adheres to portions of the graphene on the hydrophobic regions of the patterned substrate. The portions of the graphene on the hydrophilic region are therefore exposed and etched during operation 150.

In some embodiments, a surfactant resist is applied to the graphene and selectively adheres to portions of the graphene on the hydrophilic regions of the patterned substrate. The portions of the graphene on the hydrophobic region are therefore exposed and etched during operation 150. In some embodiments, a surfactant resist is applied to the graphene and selectively adheres to portions of the graphene on the hydrophobic regions of the patterned substrate. The portions of the graphene on the hydrophilic region are therefore exposed and etched during operation 150.

Figure 2E:
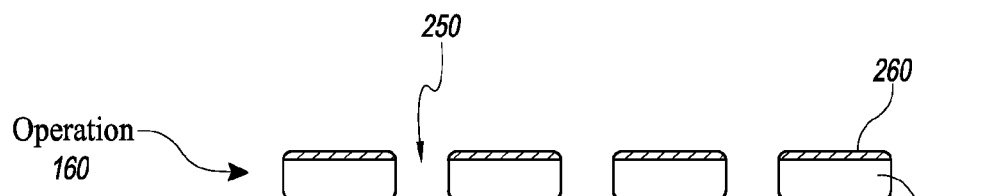

At operation 160, "Removing the resist" may be carried out after etching the exposed portions of the graphene. Operation 160 may be accomplished by standard techniques known to those skilled in the art. The technique used may be selected based on the chemical character of the resist. Resists may, for example, be removed with appropriate hydrophilic or hydrophobic solvents, heating, and optionally mild sonication. In some embodiments, resists having cross-linked counterion groups may be removed by separating the counterions, such as adding a stronger acid than the acidic counterion or adding a stronger base than the basic counterion. In some embodiments, operation 160 may include dissolving the resist, applying dithiothreitol to the resist, or heating the resist. FIG. 2E shows patterned substrate 200 and etched graphene 260 disposed on the first surface of the patterned substrate after performing operation 160.

The method may also optionally include removing at least one of the etched graphenes from the patterned substrate. The etched graphene may be removed according to standard techniques known in the art. In some embodiments, removing at least one of the etched graphenes from the patterned substrates may include adhering at least one of the etched graphenes to a release tape, peeling the release tape such that at least one of the etched graphenes separates from the patterned substrate; and heating and/or irradiating the release tape to separate at least one of the etched graphenes from the release tape. In some embodiments, the release tape is a thermal release tape, which reduces adhesiveness upon heating. In some embodiments, the release tape is an irradiation release tape, which reduces adhesiveness upon irradiation with, for example, ultraviolet light.

Some embodiments disclosed herein include a graphene composite having a patterned substrate that may include one or more hydrophobic regions and one or more hydrophilic regions patterned on a first surface of the patterned substrate, graphene disposed on the first surface of the patterned substrate, and a resist disposed on portions of the graphene on either the hydrophobic regions or hydrophilic regions of the patterned substrate. The graphene composite may be obtained, for example, when performing the methods of etching a graphene structure disclosed in the present application (for example, method 100 as depicted in FIG. 1). For example, the graphene composite can be configured as shown in FIG. 2B or FIG. 2C. The patterned substrate, graphene, and resist may generally have the same characteristics as described above with regard to the method of etching graphene.

Some embodiments disclosed herein include a graphene composite having a patterned substrate including one or more hydrophobic regions and one or more hydrophilic regions patterned on a first surface of the patterned substrate, and one or more graphenes disposed on either the hydrophobic regions or the hydrophilic regions of the patterned substrate. The shape of each of the remaining graphene portions after etching the graphene may correspond to a shape the hydrophobic regions or hydrophilic region below the graphene. The graphene composite may be obtained, for example, when performing the methods of etching a graphene structure disclosed in the present application (for example, method 100 as depicted in FIG. 1). For example, the graphene composite can be configured as shown in FIG. 2D or FIG. 2E. The patterned substrate and graphene may generally have the same characteristics as described above with regard to the method of etching graphene.

In some embodiments, a shape of each of the remaining graphene portions after etching the graphene may correspond to a shape of the hydrophobic regions or hydrophilic regions below the graphene. In some embodiments, the graphene may be disposed on the hydrophobic regions and the shape of each of the graphene portions after the etching corresponds to the shape of the hydrophobic regions below the graphene. In some embodiments, the graphene may be disposed on the hydrophilic regions and the shape of each of the graphene portions after etching the graphene may correspond to the shape of the hydrophilic regions below the graphene.

In some embodiments, the graphene composite includes a cured resist disposed on a side of the graphene opposite the patterned substrate. The cured resist may generally have the same characteristics as described above with regard to the method of etching graphene. For example, the cured resist can be a block copolymer that is cross-linked using an appropriate crosslinking agent.

Figure 3:
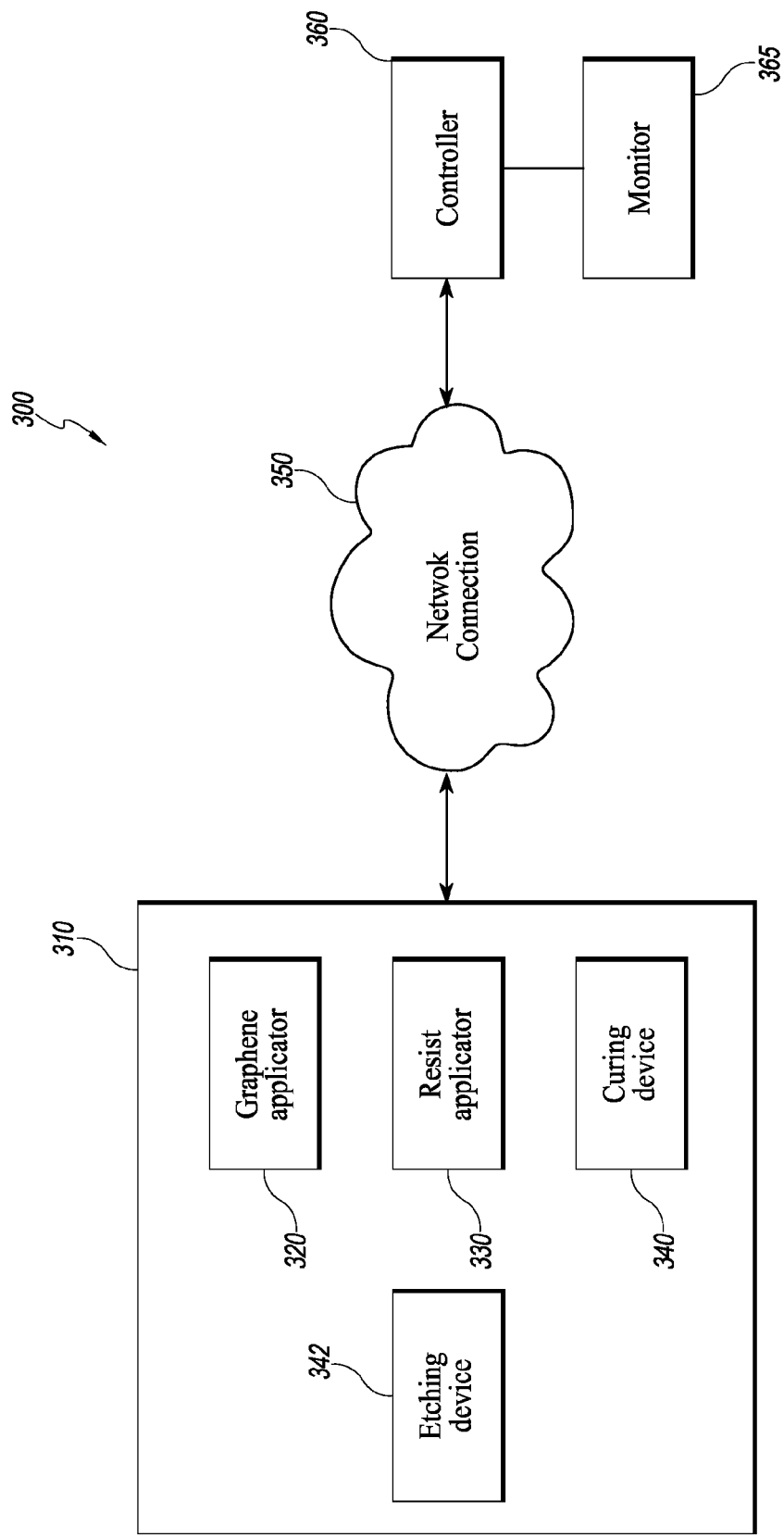
FIG. 3 is a block diagram illustrating one example of a system that is configured to control one or more operations in accordance with at least some embodiments.

Some embodiments disclosed herein include a system for making etched graphene. FIG. 3 is a block diagram illustrating one example of a system that is configured to control one or more operations in accordance with at least some examples of the present disclosure. For example, equipment for performing operations for the flow diagram of FIG. 1 may be included in system 300.

System 300 may include a processing plant or facility 310 that is arranged in communication with a controller or processor 360. Processor or controller 360 may be the same or different controller as processor 410 described later with respect to FIGS. 4A-B. In some embodiments, processing plant or facility 310 may be adapted to communicate with controller 360 via a network connection 350. Network connection 350 may be a wireless connection or a wired connection or some combination thereof.

In some embodiments, controller 360 may be adapted to communicate operating instructions for various systems or devices in processing plant 310, which may include, for example, control of one or more operating conditions. Controller 360 may be configured to monitor or receive information from processing plant 310 and utilize the information as feedback to adjust one or more operating instructions communicated to processing plant 310.

In some embodiments, the operating conditions may be presented on a monitor or display 365 and a user may be configured to interact with a user interface (not shown) to adapt or adjust various aspects of the processing. Non-limiting examples of aspects of the process that may be presented on monitor or display 365 may include time, temperature, pressure, type of resist, graphene thickness, etching time, curing time, and the like. Monitor 365 may be in the form of a cathode ray tube, a flat panel screen such as an LED display or LCD display, or any other display device. The user interface may include a keyboard, mouse, joystick, write pen or other device such as a microphone, video camera or other user input device.

In some embodiments, processing facility 310 may include one or more of graphene applicator 320, resist applicator 330, curing device 340, and/or etching device 342. In some embodiments, graphene applicator 320 may be configured via controller 360 to apply graphene to a patterned substrate comprising one or more hydrophilic regions and one or more hydrophobic regions (for example, as in operation 120 depicted in FIG. 1). Controller 360 may be configured to adjust the graphene to maintain conditions effective to apply graphene to the patterned substrate, and in some embodiments, such that the graphene layer may have a selected thickness of, for example, about 2 nm or less, formed on the patterned substrate. Graphene applicator 320 may include one or more of a thermal release tape and a heater device. In some embodiments, the heater device may be configured via controller 360 to heat the thermal release tape such that graphene may be released from the thermal release tape onto the patterned substrate. In some embodiments, graphene applicator 320 may be fluidly coupled to one or more reservoirs containing graphene. Controller 360 may be configured to adjust valves to control an amount and/or rate of materials delivered from the one or more reservoirs into graphene applicator 320.

Resist applicator 330 may be configured via controller 360 to apply a resist to the graphene layer such that the resist selectively adheres to portions of the graphene on either the hydrophobic regions or the hydrophilic region of the patterned substrate (for example, as in operation 130 depicted in FIG. 1). Resist applicator 330 may include one or more of a dip coater, a spin coater, a roll coater, a rod-bar coater, a spray coater, an air knife coater, or a slot-die coater. Controller 360 may be configured to adjust the resist applicator to maintain conditions effective to apply the resist. In some embodiments, resist applicator 330 may be fluidly coupled to a reservoir containing a resist. Controller 360 may be configured to adjust a valve to control an amount and/or rate of materials delivered from the reservoir into resist applicator 330. Controller 360 may be configured to adjust the valve to control an amount and/or rate of graphene delivered from graphene applicator 320 into resist applicator 330.

Curing device 340 may be configured via controller 360 to cure the resist (for example, as in operation 140 depicted in FIG. 1). Curing device 340 may include one or more of a radiation source, a heater device, a dip coater, a spin coater, a roll coater, a rod-bar coater, a spray coater, an air knife coater, or a slot-die coater. Controller 360 may be configured to adjust the curing device to maintain conditions effective to cure the resist. In some embodiments, curing device 340 can be fluidly coupled to resist applicator 330 via a valve. Controller 360 may be configured to adjust the valve to control an amount and/or rate of resist delivered from resist applicator 330.

Etching device 342 may be configured via controller 360 to etch exposed portions of graphene to form one or more etched graphenes (for example, as in operation 150 depicted in FIG. 1). Etching device 342 may be, for example, a plasma etcher. Controller 360 may be configured to adjust the etching device to maintain conditions effective to etch exposed portions of graphene to form one or more etched graphenes. In some embodiments, etching device 342 can be fluidly coupled to curing device 340 via a valve. Controller 360 may be configured to adjust the valve to control an amount and/or rate of cured resist delivered from curing device 340.

Figure 4A:
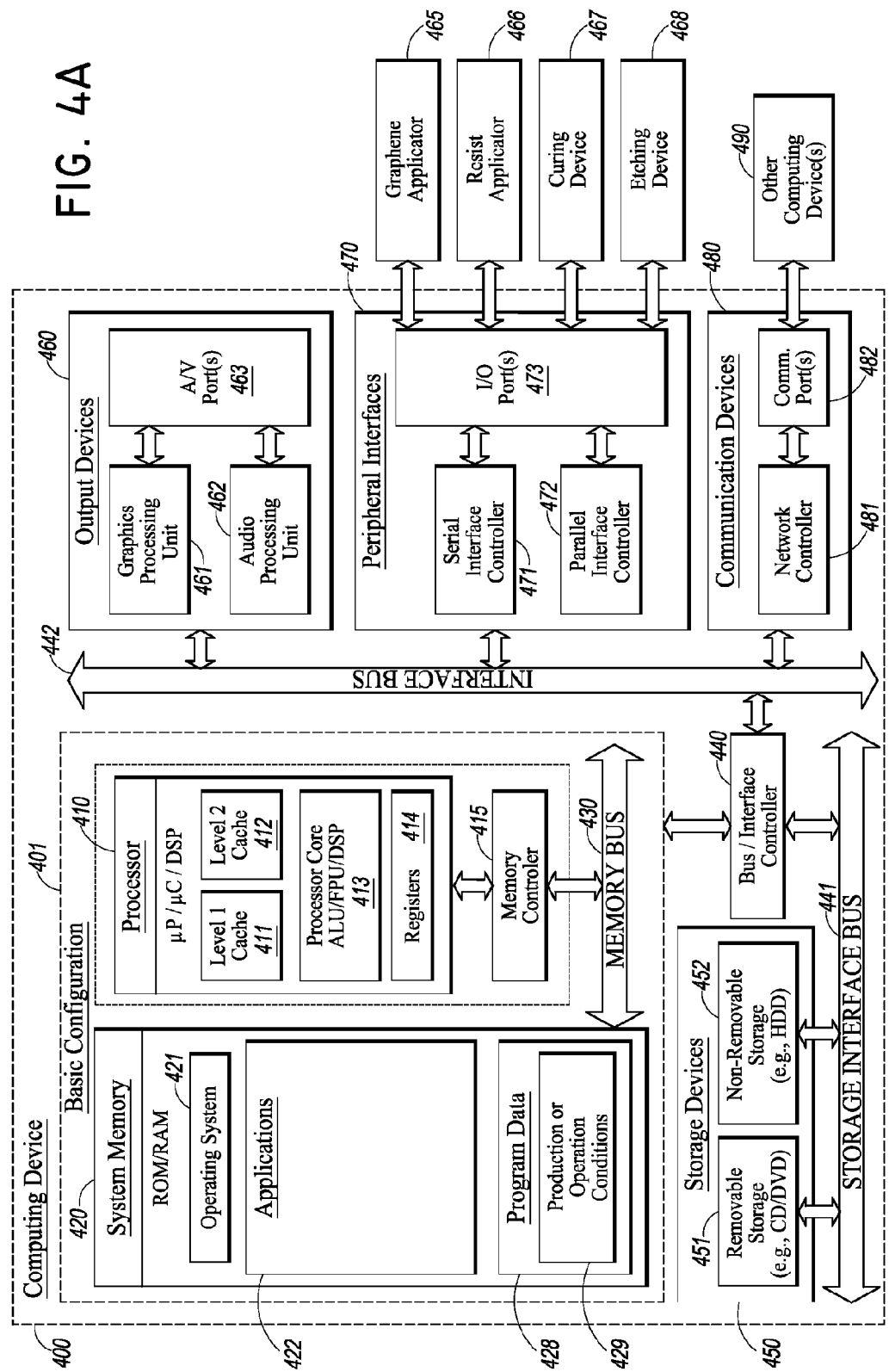
FIGS. 4A-B are a block diagram illustrating one example of a computing device that may be configured to control one or more operations in accordance with at least some embodiments.
Figure 4B:
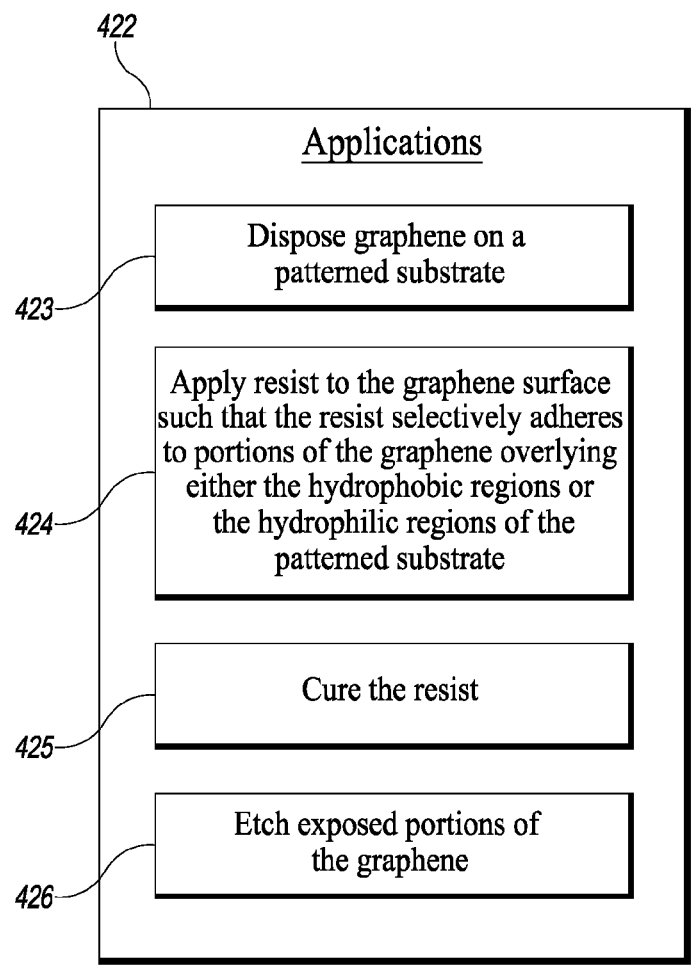

FIGS. 4A-B is a block diagram illustrating one example of a computing device that may be configured to control one or more operations in accordance with at least some examples of the present disclosure. For example, operations for the flow diagram of FIG. 1 may be performed by computing device 400. In a very basic configuration, computing device 400 typically includes one or more controllers or processors 410 and system memory 420. A memory bus 430 may be used for communicating between the processor 410 and the system memory 420.

Depending on the desired configuration, processor 410 may be of any type including but not limited to a microprocessor (µP), a microcontroller (µC), a digital signal processor (DSP), or any combination thereof. Processor 410 may include one or more levels of caching, such as a level one cache 411 and a level two cache 412, a processor core 413, and registers 214. The processor core 413 may include an arithmetic logic unit (ALU), a floating point unit (FPU), a digital signal processing core (DSP Core), or any combination thereof. A memory controller 415 may also be used with the processor 410, or in some implementations the memory controller 415 may be an internal part of the processor 410.

Depending on the desired configuration, the system memory 420 may be of any type including but not limited to volatile memory (such as RAM), non-volatile memory (such as ROM, flash memory, etc.), or any combination thereof. System memory 420 typically includes an operating system 421, one or more applications 422, and program data 426. As shown in FIG. 4B, applications 422 may include, for example, "Dispose graphene on a patterned substrate" at application 423; "Apply resist to the patterned substrate such that the resist selectively adheres to portions of the graphene on either the hydrophobic or the hydrophilic regions on the patterned substrate" at application 424; "Cure the resist" at operation 425; and "Etch exposed portions of the graphene" at operation 426. These applications may correspond to operation 120, operation 130, operation 140, and operation 150, respectively, as depicted in FIG. 1. Returning to FIG. 4A, program data 428 may include, for example, production data and/or operating conditions data 429 that may be used by one or more of applications 423-426.

Computing device 400 may have additional features or functionality, and additional interfaces to facilitate communications between the basic configuration 401 and any required devices and interfaces. For example, a bus/interface controller 440 may be used to facilitate communications between the basic configuration 401 and one or more data storage devices 450 via a storage interface bus 441. The data storage devices 450 may be removable storage devices 451, non-removable storage devices 452, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives, to name a few. Example computer storage media may include volatile and nonvolatile, removable and non-removable media implemented in any method or technology for storage of information, such as computer readable instructions, data structures, program modules, or other data.

System memory 420, removable storage 451, and non-removable storage 452 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that may be used to store the desired information and that may be accessed by computing device 400. Any such computer storage media may be part of device 400.

Computing device 400 may also include an interface bus 442 for facilitating communication from various interface devices (for example, output interfaces, peripheral interfaces, and communication interfaces) to the basic configuration 401 via the bus/interface controller 440. Example output devices 460 include a graphics processing unit 461 and an audio processing unit 462, which may be configured to communicate to various external devices such as a display or speakers via one or more A/V ports 463. Example peripheral interfaces 470 include a serial interface controller 471 or a parallel interface controller 472, which may be configured to communicate with external devices such as input devices (for example, keyboard, mouse, pen, voice input device, touch input device, etc.) or other peripheral devices (for example, printer, scanner, etc.) via one or more I/O ports 473. For example, in some embodiments, graphene applicator 465, resist applicator 466, curing device 467, and etching device 468 may be optionally connected via an I/O port and used to deposit nanostructures onto a substrate. An example communications device 480 includes a network controller 481, which may be arranged to facilitate communications with one or more other computing devices 490 over a network communication via one or more communication ports 482.

The communications connection is one example of a communication media. Communication media may typically be embodied by computer readable instructions, data structures, program modules, or other data in a modulated data signal, such as a carrier wave or other transport mechanism, and include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR), and other wireless media.

EXAMPLES

Additional embodiments are disclosed in further detail in the following examples, which are not in any way intended to limit the scope of the claims.

Example 1

Improved Graphene Etching Using a Hydrophilic Resist

A patterned substrate is provided by using a GaAs substrate patterned using poly(2-vinylpyridine) to form a patterned substrate. On the patterned substrate, a graphene layer is overlayed by tape method, followed by baking in an argon environment at 400° C. to form a graphene-coated patterned substrate. Over the graphene surface of the graphene-coated patterned substrate, poly(methyl glutarimide) (PMGI) or PMMA resist is deposited such that the resist overlies the hydrophilic regions of the patterned substrate. The resist is then cured by UV radiation, using tetramethylammonium hydroxide as a developer for PMGI. The graphene layer is then etched by oxygen-based plasma. Finally, the resist is removed by Microposit Remover 1165 (Shipley Company, Marlborough, Mass., United States) to yield a patterned graphene. The resulting shape of the etched graphene corresponds to the shape of the hydrophilic regions of the patterned substrate.

The patterned substrate can then be removed from the etched graphene by adhering the etched graphene to a release tape (for example, Graphene Transfer Tape). The release tape is then peeled to separate the etched graphene from the patterned substrate. Finally, the release tape is heated to 100° C. to separate the etched graphene from the release tape.

The graphene etching method of this example provides the advantage of performing graphene lithography with features, precision and complexity comparable to modern semiconductor lithography. The graphene etching method of this example also provides the advantage of integrating with processes and apparatus of modern semiconductor lithography; thus, complex graphene features may be fabricated on chip with other metal and semiconductor components.

Example 2

Improved Graphene Etching Using a Hydrophobic Surfactant Resist

A patterned substrate is provided by using a silicon substrate patterned using $CF_4$ plasma etching to form a patterned substrate. On the patterned substrate, a graphene layer is overlayed by tape method, followed by baking in Argon environment at 400° C. to form a graphene-coated patterned substrate. Over the graphene surface of the graphene-coated patterned substrate, a heptadecafluoro-2-hydroxyundecyl resist is deposited such that the resist overlies the hydrophobic regions of the patterned substrate. The resist is then cured by UV radiation. The graphene layer is then etched by oxygen-based plasma. Finally, the resist is removed by heating to 200-350° C. to yield a patterned graphene. The resulting shape of the etched graphene corresponds to the shape of the hydrophobic regions of the patterned substrate.

The patterned substrate can then be removed from the etched graphene by adhering the etched graphene to a release tape (for example, Graphene Transfer Tape). The release tape is then peeled to separate the etched graphene from the patterned substrate. Finally, the release tape is heated to 100° C. to separate the etched graphene from the release tape.

The graphene etching method of this example provides the advantage of performing graphene lithography with features, precision and complexity comparable to modern semiconductor lithography. The graphene etching method of this example also provides the advantage of integrating with processes and apparatus of modern semiconductor lithography; thus, complex graphene features may be fabricated on chip with other metal and semiconductor components.

With respect to the use of substantially any plural and/or singular terms herein, those having skill in the art can translate from the plural to the singular and/or from the singular to volume of wastewater can be received in the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (for example, " a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (for example, " a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. Finally, as will be understood by one skilled in the art, a range includes each individual member. Thus, for example, a group having 1-3 articles refers to groups having 1, 2, or 3 articles. Similarly, a group having 1-5 articles refers to groups having 1, 2, 3, 4, or 5 articles, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

What is claimed is:

1. A method for etching graphene, the method comprising:
providing a patterned substrate comprising one or more hydrophobic regions and one or more hydrophilic regions patterned on a surface of the patterned substrate;
disposing graphene on the one or more hydrophobic regions and on the one or more hydrophilic regions patterned on the surface of the patterned substrate;
applying a resist to a surface of the graphene opposite to the patterned substrate, wherein applying the resist to the surface of the graphene comprises applying a hydrophobic resist or a hydrophilic resist to the surface of the graphene, the hydrophobic resist selectively adheres to portions of the surface of the graphene overlying the one or more hydrophobic regions of the patterned substrate and the hydrophilic resist selectively adheres to portions of the surface of the graphene overlying the one or more hydrophilic regions of the patterned substrate, and wherein portions of the surface of the graphene not covered by the resist form exposed portions of the graphene; and etching the exposed portions of the graphene to form one or more etched graphene structures.

2. The method of claim 1, further comprising curing the resist.

3. The method of claim 1, wherein applying the resist to the surface of the graphene comprises applying the hydrophobic resist to the surface of the graphene, the hydrophobic resist selectively adheres to portions of the surface of the graphene overlying the hydrophobic regions of the patterned substrate.

4. The method of claim 3, wherein etching the exposed portions of the graphene comprises etching portions of the graphene overlying the hydrophilic regions of the patterned substrate.

5. The method of claim 1, wherein applying the resist to the surface of the graphene comprises applying the hydrophilic resist to the surface of the graphene, the hydrophilic resist selectively adheres to portions of the surface of the graphene overlying the hydrophilic regions of the patterned substrate.

6. The method of claim 5, wherein etching the exposed portions of the graphene comprises etching portions of the graphene overlying the hydrophobic regions of the patterned substrate.

7. The method of claim 1, wherein applying the hydrophilic resist or the hydrophobic resist to the surface of graphene comprises applying a hydrophilic surfactant resist or a hydrophobic surfactant resist to the surface of the graphene.

8. The method of claim 7, wherein the hydrophilic surfactant resist or the hydrophobic surfactant resist comprises one or more of a block copolymer, a vinyl-containing surfactant, a thiol-containing surfactant, a phospholipid surfactant, a nonionic surfactant, or a haloalkyl group.

9. The method of claim 1, further comprising removing the resist after etching the exposed portions of the graphene.

10. The method of claim 1, further comprising removing the patterned substrate from the one or more etched graphene structures, wherein removing the patterned substrate comprises:

adhering one or more of the etched graphene structures to a release tape;

peeling the release tape to separate the one or more of the etched graphene structures from the patterned substrate; and heating and/or irradiating the release tape to separate the one or more of the etched graphene structures from the release tape.

11. The method of claim 1. wherein the one or more hydrophobic regions comprises one or more of a void, a non-polar polymer, and a fluoropolymer.

12. A graphene composite comprising:

a patterned substrate comprising one or more hydrophobic regions and one or more hydrophilic regions patterned on a surface of the patterned substrate;

graphene disposed on the one or more hydrophobic regions and on the one or more hydrophilic regions patterned on the surface of the patterned substrate; and a resist disposed on portions of a surface of the graphene opposite to the patterned substrate, wherein the resist is a hydrophobic resist or a hydrophilic resist, the hydrophobic resist is disposed on portions of the substrate overlying the one or more hydrophobic regions of the patterned substrate and the hydrophilic resist is disposed on portions of the substrate overlying the one or more hydrophilic regions of the patterned substrate.

13. The graphene composite of claim 12, wherein the one or more hydrophobic regions comprise one or more of a void, a non-polar polymer, and a fluoropolymer.

14. The graphene composite of claim 12, wherein the resist is the hydrophobic resist and is disposed on portions of the surface of the graphene overlying the one or more hydrophobic regions of the patterned substrate.

15. The graphene composite of claim 14, wherein the hydrophobic resist comprises one or more of an aryl-epoxy resin, a poly(methyl methacrylate), a phenol formaldehyde resin, and a fluorinated block copolymer containing 2-methyl-2-adamantyl methacrylate and perfluoroalkyl methacrylate.

16. The graphene composite of claim 12, wherein the resist is the hydrophilic resist and is disposed on portions of the surface of the graphene overlying the one or more hydrophilic regions of the patterned substrate.

17. The graphene composite of claim 16, wherein the hydrophilic resist comprises one or more of a poly(methyl glutarimide), a poly (methyl methacrylate), and a phenol formaldehyde resin.

18. A graphene composite comprising:

a patterned substrate comprising one or more hydrophobic regions and one or more hydrophilic regions patterned on a surface of the patterned substrate;

one or more graphene structures overlying the one or more hydrophobic regions or the one or more hydrophilic regions of the patterned substrate, wherein a shape of the one or more graphene structures corresponds to a shape of the hydrophobic regions or the hydrophilic regions of the patterned substrate; and a resist disposed on portions of a surface of the graphene opposite to the patterned substrate, wherein the resist is a surfactant resist and is disposed on portions of the substrate overlying either the one or more hydrophobic regions or the one or more hydrophilic regions of the patterned substrate.

19. The graphene composite of claim 18, wherein the resist is a cured resist.

20. The composite of claim 18, wherein the one or more graphene structures are not covered by the resist and form the exposed portions of the graphene.

21. The graphene composite of claim 18, wherein the surfactant resist comprises one or more of a block copolymer, a vinyl-containing surfactant, a thiol-containing surfactant, a phospholipid surfactant, a nonionic surfactant, or a haloalkyl group.

* * * * *

UNITED STATES PATENT AND TRADEMARK OFFICE
CERTIFICATE OF CORRECTION

| | | |
|---|---|---|
| PATENT NO. | : 9,919,929 B2 | |
| APPLICATION NO. | : 15/100616 | |
| DATED | : March 20, 2018 | |
| INVENTOR(S) | : Anderson et al. | |

It is certified that error appears in the above-identified patent and that said Letters Patent is hereby corrected as shown below:

In the Drawings

In Fig. 4A, Sheet 4 of 5, for Tag "415", in Line 2, delete "Controler" and insert -- Controller --, therefor.

In the Specification

In Column 2, Line 35, delete "are a block diagram" and insert -- are block diagrams --, therefor.

In Column 10, Line 28, delete "is a block diagram" and insert -- are block diagrams --, therefor.

In Column 10, Line 44, delete "registers 214." and insert -- registers 414. --, therefor.

In Column 10, Line 48, delete "implementations" and insert -- implementations, --, therefor.

In Column 13, Line 34, delete "recitation" and insert -- recitation, --, therefor.

In Column 13, Line 55, delete "general" and insert -- general, --, therefor.

In Column 13, Line 63, delete "general" and insert -- general, --, therefor.

In the Claims

In Column 16, Line 50, in Claim 20, delete "The composite" and insert -- The graphene composite --, therefor.

Signed and Sealed this
Fifth Day of June, 2018

Andrei Iancu
*Director of the United States Patent and Trademark Office*